United States Patent [19]

Ooi

[11] Patent Number: 5,189,593

[45] Date of Patent: Feb. 23, 1993

[54] INTEGRATED DISTRIBUTED RESISTIVE-CAPACITIVE NETWORK

[75] Inventor: Leng H. Ooi, Sunrise, Fla.

[73] Assignee: Motorola, Inc., Schaumburg, Ill.

[21] Appl. No.: 787,278

[22] Filed: Nov. 4, 1991

[51] Int. Cl.⁵ .................. H01G 3/075; H01L 29/92; H03H 7/06

[52] U.S. Cl. .................. 455/195.1; 333/174; 361/311; 257/295; 257/310; 257/312; 257/533

[58] Field of Search .................. 361/311, 312, 313; 357/14, 20, 51; 29/25.42; 333/72, 174

[56] References Cited

U.S. PATENT DOCUMENTS

| | | | |
|---|---|---|---|
| 3,727,154 | 4/1973 | Dailing et al. | 333/72 |
| 3,819,990 | 6/1974 | Hayashi et al. | 29/25.42 X |
| 4,987,459 | 1/1991 | Kasahara | 357/14 |
| 5,028,894 | 7/1991 | Speake | 333/174 |
| 5,060,110 | 10/1991 | Kane | 361/311 |

*Primary Examiner*—Donald Griffin
*Attorney, Agent, or Firm*—M. Mansour Ghomeshi

[57] ABSTRACT

An integrated-distributed-resistive-capacitive network (100) having a high dielectric electronically-tunable semiconductor integrated capacitor. The network (100) also includes a resistive layer (126) formed on the high dielectric semiconductor integrated capacitor, to provide the distributed resistance of the network (100). External contact to the resistive portion of the network (100) is provided via a plurality of contact terminals (122A and 122B) which are coupled to the resistive layer (126).

4 Claims, 4 Drawing Sheets

INTEGRATED DISTRIBUTED RESISTIVE-CAPACITIVE NETWORK

TECHNICAL FIELD

This invention is generally related to resistive-capacitive networks and more particularly related to distributed resistive-capacitive networks.

BACKGROUND

High-quality capacitors are an integral part of many electrical circuits. Capacitors are available in a variety of values with different characteristics. Variable capacitors having a wide dynamic range are available only in bulk sizes rendering them useless for miniature electronic applications. Semiconductor variable capacitors, referred to as varactors, are available, however with very narrow dynamic range. Tunable electronic circuits such as filters and oscillators are presently tuned using fixed components for coarse tune and tunable capacitors or inductors for fine tune.

Electronic devices, and in particular communication devices, utilize a variety of circuits such as filters and oscillators that must be tuned for proper operation. These circuits use a combination of fixed and tunable components to achieve their objectives. Fixed components are used along with tunable components to provide the tunable circuit with sufficient dynamic range. The need for fixed value components has resulted in the inability to design and manufacture a common circuit to operate over a desired range. Communication devices operating in a particular band must be proliferated to perform at different segments of that band due to the unavailability of alternative and tunable components. Each board is equipped with a different fixed value component along with a variable characteristic component to achieve the desired performance specifications.

Another area of deficiency in electronic devices is the area of distributed resistive-capacitive networks. These networks are particularly beneficial in communication devices. Present distributed networks are also used in proliferation. That is, several circuits are designed and fabricated which perform the same function at different regions of their performance spectrum. The impact of proliferation is obvious on product cost, inventory, handling, troubleshooting, quality and a score of other problems. Some techniques have been employed to avoid proliferation with some degree of success. One such technique is laser trimming of printed components. This procedure only available to high frequency applications is limited in range and can only reduce the number of boards performing similar functions and not totally eliminating the need for such proliferation. A need is therefore clear for a tunable network having a wide dynamic range with reactive characteristics.

SUMMARY OF THE INVENTION

An integrated-distributed-resistive-capacitive network is provided having a high dielectric electronically-tunable semiconductor integrated capacitor. The network also includes a resistive layer formed on the high dielectric semiconductor integrated capacitor to provide the distributed resistance of the network. External contact to the resistive portion of the network is provided via a plurality of contact terminals which are coupled to the resistive layer.

DETAILED DESCRIPTION OF THE PREFERRED EMBODIMENT

A voltage variable capacitor, also known as a varactor, variable capacitance diode, or varacap, is a semiconductor device characterized by voltage sensitive capacitance which resides in the space-charge region at the surface of a semiconductor bounded by an insulating layer. Varactors are very limited in their dynamic range and are useful only in high frequency applications where low capacitance values are used. Distributed resistive-capacitive networks are circuits having distributed series resistive and shunt capacitive elements. These circuits have fixed capacitive elements and can not be integrated. This invention provides a network having distributed resistive and capacitive characteristics which overcomes the deficiencies of the prior art.

Figure 1:
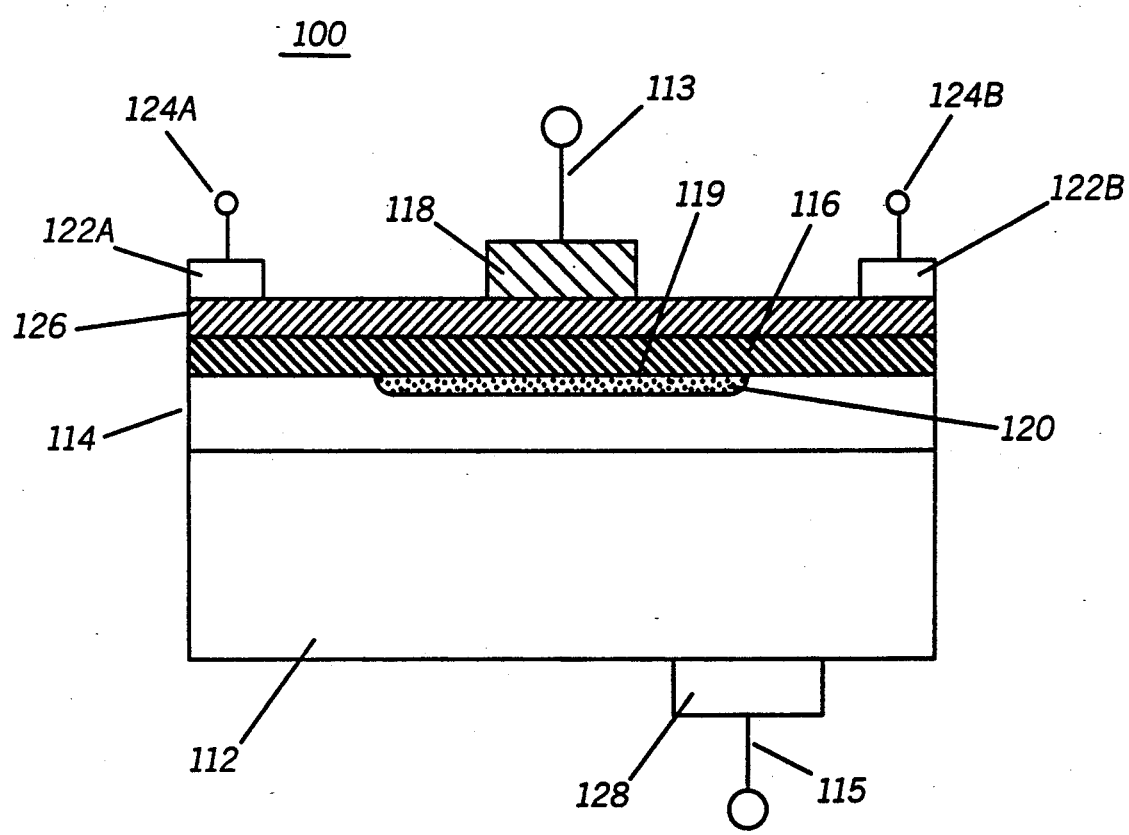
FIG. 1 is a cross-sectional view of a resistive-capacitive network made in accordance with the invention.

Referring now to FIG. 1, there is shown a cross-sectional view of an electronically tunable-distributed resistive-capacitive network 100, in accordance with the principles of the present invention. The network 100 may be tuned via a voltage applied to two control lines 113 and 115. The resistive-capacitive network 100 is formed on a semiconductor substrate 112 having a surface layer 114 being less heavily doped than the substrate 112. The surface layer 114, being less heavily doped, has a higher resistivity than the semiconductor and serves as an area for a space-charge or depletion layer 120 to form. An insulator layer 116 is applied over the surface layer 114. At least one metal plate 118 is formed on the insulator layer 116. The metal plate 118 provides the external contact to the reactance component of the network 100 via a contact pin 113. More metal plates along with contacts may be formed on the insulator layer 116 to provide further control over the distributed capacitance of the network 100. A resistive layer 126 is formed on the insulating layer 116 surrounding the metal plate 118 to provide the resistive element of the network 100. This resistive layer 126 may be any NicolChromium material having resistive characteristics desired by the requirements of the network 100. Two metal plates 122A and 122B are formed on the resistive layer 126 to provide external contact with the resistive component of the network 100.

The insulator layer 116 is preferably Zirconium Titanate (ZrTiO$_4$) applied in a thickness from 300 Ångstroms to 1000 Ångstroms, but thicknesses from 100 Ångstroms to 2 microns have been found to be suitable. The material employed as the dielectric or insulating layer should have a dielectric constant much greater than that of the semiconductor. Examples of suitable materials that may be used for this purpose are to be found in Table 1 below:

TABLE 1

| | |
|---|---|
| tantalum pentoxide | $Ta_2O_5$ |
| niobium pentoxide | $Nb_2O_5$ |
| zirconium oxide | $ZrO_2$ |
| titanium dioxide | $TiO_2$ |
| zirconium titanate | $ZrTiO_4$ |
| strontium titanate | $SrTiO_3$ |
| barium titanate | $BaTiO_3$ |
| lead titanate | $PbTiO_3$ |
| barium tetratitanate | $Ba_2Ti_9O_{20}$ |
| barium neodymium titanate | $BaNd_2Ti_5O_{14}$ |
| lead-zirconium titanate | $Pb(Zr,Ti)O_3$ |
| lead-lanthanum zirconium titanate | $(Pb,La)(Zr,Ti)O_3$ |
| lithium niobate | $LiNbO_3$ |
| strontium-barium niobate | $(Sr,Ba)Nb_2O_6$ |

Oxides of additional elements such as molybdenum, tungsten and vanadium may also be expected to be useful, either alone or in combination with other elements.

When an appropriate reverse bias is applied between the metal electrodes 118, and 128 mobile minority charge carriers are attracted to a semiconductor insulator interface 119, forming the depletion layer 120, which extends for some distance into the conductor 114. This depletion layer behaves as a variable width capacitor which is electrically in series with the capacitor formed by the insulator layer 116. These two series capacitors serve to create a net capacitance effect that is affected by the changes of each individual capacitor. The electrode bias voltage controls the width of the depletion layer 120 from zero at the accumulation threshold to a maximum thickness at the inversion threshold and thereby varies the total capacitance of the device. The insulator layer 116 serves to provide the spacing between the top electrode 118 and the depletion layer 120. The depletion layer 120 is a transient layer formed when the bias voltage is applied to the capacitor through input contacts 113 and 115. The depletion layer 120, hence the distributed capacitance, may be reduced or disappear when the applied voltage field is varied or removed. Although shown in the drawing as a distinct feature, the depletion layer 120 should not be regarded as a permanent mechanical feature of the network 100. The operation theory described herein is similar to that found in operation of metal-oxide-semiconductor capacitors.

At the inversion threshold voltage, enough charge carriers have been attracted to the semiconductor interface such that an inversion layer is formed. Increasing the voltage bias increases the width of the inversion layer, until the layer reaches a maximum width, beyond which the depletion layer cannot be substantially increased by increasing electrode bias voltage. The maximum depletion width is determined by the concentration of the impurity dopant near the semiconductor surface onto which the insulator layer 116 has been deposited. Dopants such as phosphorous, antimony, boron and arsenic will be recognized by those skilled in the art to be useful with silicon substrates. Other semiconductor substrates, such as gallium arsenide, may also be utilized to form a VVC in accordance with the invention.

The lower the doping, the larger the maximum depletion layer thickness, and thus, the lower minimum capacitance which can be achieved. The thickness of a less heavily doped surface layer may be chosen to be equal to or slightly greater than this maximum depletion width in order to minimize the series resistance of the device while maximizing the capacitance change.

Formation of an improved voltage tunable resistive capacitive network is highly dependent upon the choice of the material comprising the insulator layer 116. By choosing a material with a much larger relative dielectric constant than the semiconductor depletion layer 120, a larger ratio of maximum-to-minimum distributed capacitance will be obtained. The larger the insulator's dielectric constant, the larger the capacitance ratio in capacitance per unit area will be for a given insulator thickness.

Many materials with very high dielectric constants have ferroelectric properties which are not desirable for high frequency devices. The polarization for a ferroelectric material has a hysteresis loop, or memory, whereby a residue polarization remains after an applied bias voltage has been removed. Thus, a residual depletion layer would also remain and thereby limit the capacitance ratio which may be obtained. These materials would be best utilized in lower frequency applications.

A low-loss, non-ferroelectric insulator layer is required for high frequency applications, specifically those for use in radio transmitting and receiving, and especially for tunable high-Q filters. Zirconium Titanate ($ZrTiO_4$) is one suitable non-ferroelectric material with a high relative dielectric constant ($K_r$ is approximately equal to 40) and low dielectric loss. By comparison, the relative dielectric constant of silicon dioxide (used in conventional MOS capacitors) is 3.9. The dielectric constant of the depletion layer in silicon is 11.7 and the dielectric constant of the depletion layer in germanium is 15.7. It can be easily seen that the dielectric constant of the zirconium titanate and the aforementioned materials in Table 1 is much higher than that of silicon dioxide. Therefore, an improved capacitor having higher capacitance ratio can be fabricated. Thin films of zirconium titanate can be formed by any of several techniques, including but not necessarily limited to, sputtering, evaporation, chemical vapor deposition, ion beam or plasma enhanced processes, sol-gel, and other solution chemistry processes.

By choosing an insulator with a much larger relative dielectric constant than a semiconductor depletion layer, a larger ratio between the maximum capacitance at zero depletion layer thickness and the minimum capacitance at the inversion threshold can be achieved. This strategy has been largely overlooked because the theory of Metal-Insulator-Semiconductor (MIS) capacitors was developed with a silicon dioxide insulator on silicon. Because the maximum width of the depletion layer in an MIS capacitor is limited by the formation of an inversion layer, the capacitance change which can be achieved with a low dielectric constant material, such as silicon dioxide, is less than or comparable to what can be achieved by varying the depletion width around a PN junction.

Figure 2:
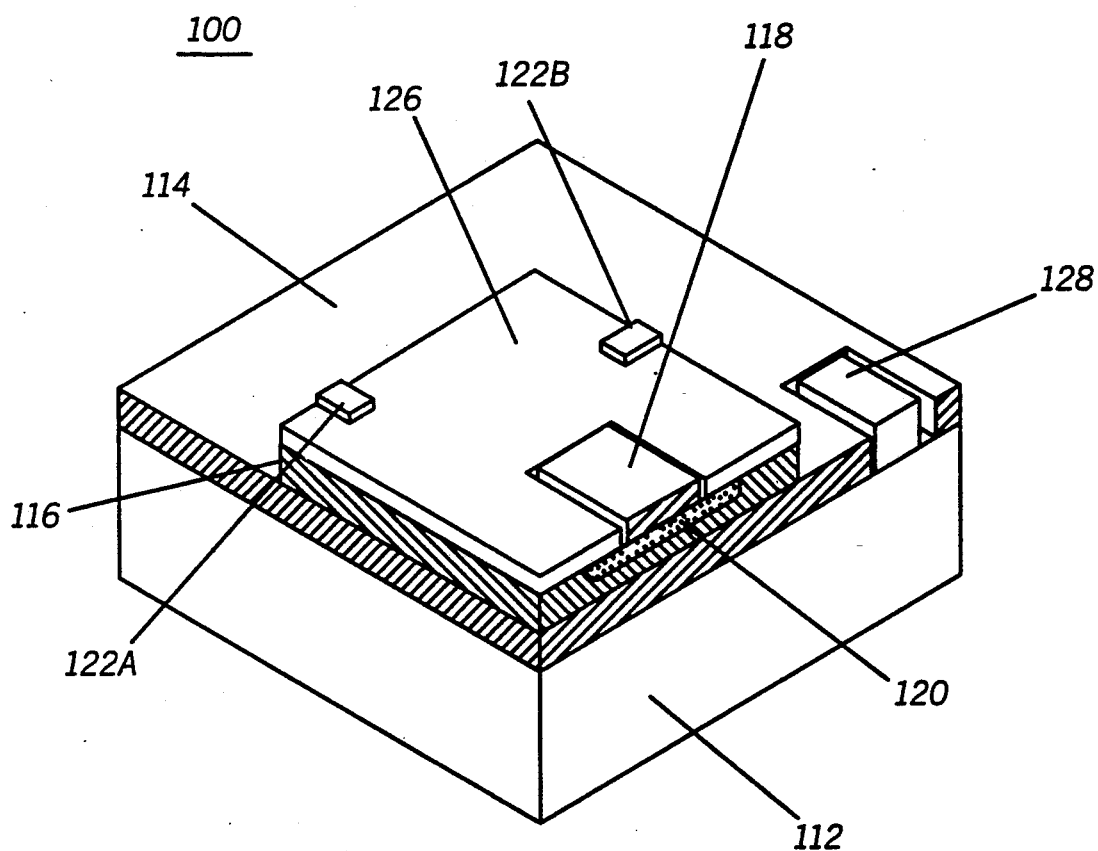
FIG. 2 is an isometric view of a resistive-capacitive network made in accordance with the invention.

Referring now to FIG. 2, an isometric view of the network 100 is shown. The various elements of the network 100 are shown in this view to better illustrate the preferred embodiment of the present invention. The presentation of this view is meant only to enhance the understanding of the layers involved in the construction of the network 100. It is not in any fashion meant to imply, directly or otherwise, a limitation on the present invention. The location of the film contacts 122A, 122B, and 128 is not critical as shown. The location of the metal plate 118, on the other hand, contributes significantly to the distribution of the capacitive element of the network 100. Various performance objectives may be met by placing these contacts in different places. Indeed more contact plates may be added on the resistive layer 126 to provide additional external contact with the network 100. The depletion region 120 is shown to be located substantially beneath the metal layer 118. As the number of metal plates such as 118 is increased to achieve a higher degree of reactance distribution, the depletion regions formed under each contact area will function as a separate shunt capacitor. It can therefore be seen that the two plates 122A and 122B represent the two ends of a resistor while the plate 118 provides the control input of an electronically tunable capacitive element in shunt with the resistor of the network 100. This is made clearer by referring to FIGS. 3A and 3B.

Figure 3A:
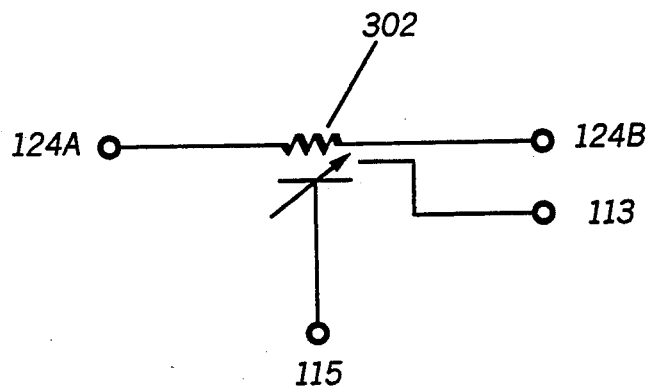
FIGS. 3A and 3B show the electrical symbol and equivalent circuit of the network of FIG. 1.
Figure 3B:
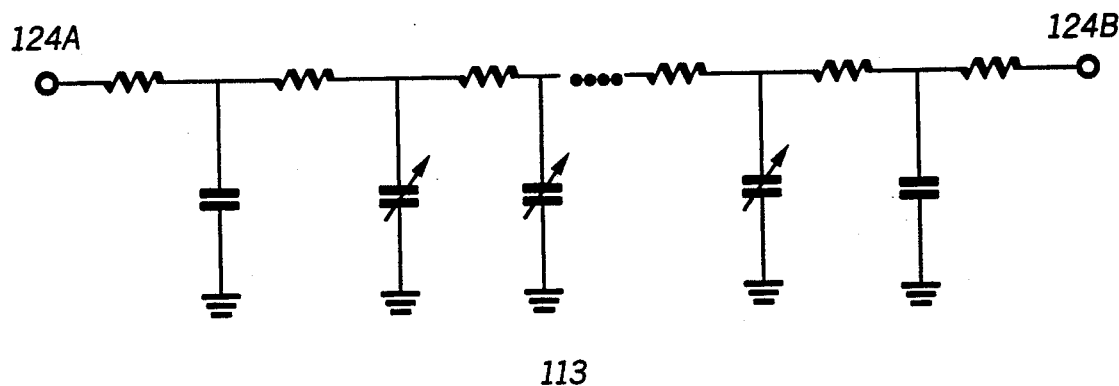

Referring now to FIGS. 3A and 3B, a symbolic representation and an equivalent electrical circuit diagram 300 of the network 100 are shown. As can be seen, in FIG. 3A the circuit 300 includes a distributed resistive component formed between contacts 124A and 124B. A wide dynamic range variable capacitor is shown to be coupled to contact 113. In an electrical sense as the control signal, applied to contact 113 is varied, so is the capacitance value seen between the contacts 124A and 124B. This variable capacitance being controlled electronically is varied in conjunction with a series distributed resistor as shown by a resistor 302. As can be seen in FIG. 3B, the network 100 appears to be a number of series resistors having a number of capacitors in shunt at the respective points of contact of each pair of the resistors. This is very significant because it makes a variety of previously unrealizable electronic networks possible. Each of the shunt capacitors may be realized by a separate depletion region formed on the network 100 via strategically located contact plates.

Figure 4:
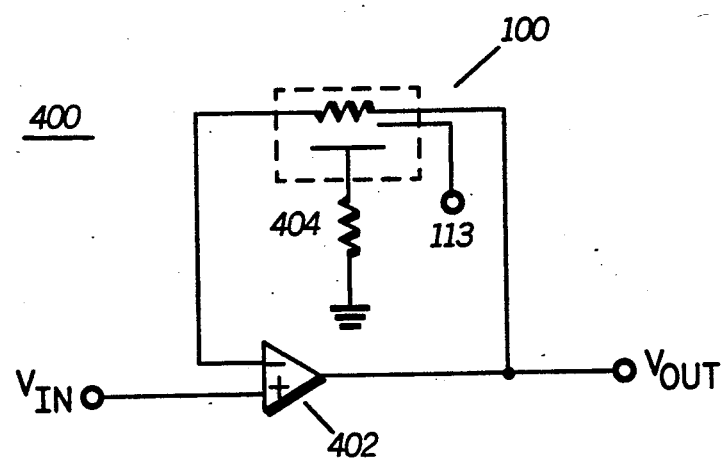
FIG. 4 is a block diagram of an electronic circuit in accordance with the present invention.

Referring to FIG. 4, a schematic diagram of a typical circuit 400 taking advantage of the distributed network 100 is shown. The circuit 400 is a band pass filter. The band pass filter 400 is shown here to illustrate the significance of the present invention, for this is a particularly difficult topology to realize without discrete components. It is obvious that any other electronic circuit having an electronically tunable network can benefit from this invention. Some such circuits are oscillators, filters of different characteristics, switches, etc. A bandpass filter is particularly chosen in the preferred embodiment to demonstrate the benefits of the present invention in accommodating the complexities that are involved in achieving desirable frequency and phase performance for such filters. The filter 400 includes an amplifier 402 having an input $V_{in}$ and an output $V_{out}$. A feedback loop is shown to couple a portion of the $V_{out}$ to the inverting input of the amplifier 402. The coupling in the feedback includes the network 100 along with a series resistor 404. By tuning the network 100, the center frequency of the filter 400 may be adjusted to a desired frequency. Since this tuning is fully electronic, there is no need to design a filter for each separate band of operation. Rather, with the ability to change its operating frequency, the same filter may be used for any band of operation. Note that although the frequency of operation of the filter 400 is shown to be variable, other performance characteristics such as bandwidth and phase performance may be tuned using the network 100 in other strategic locations.

Figure 5:
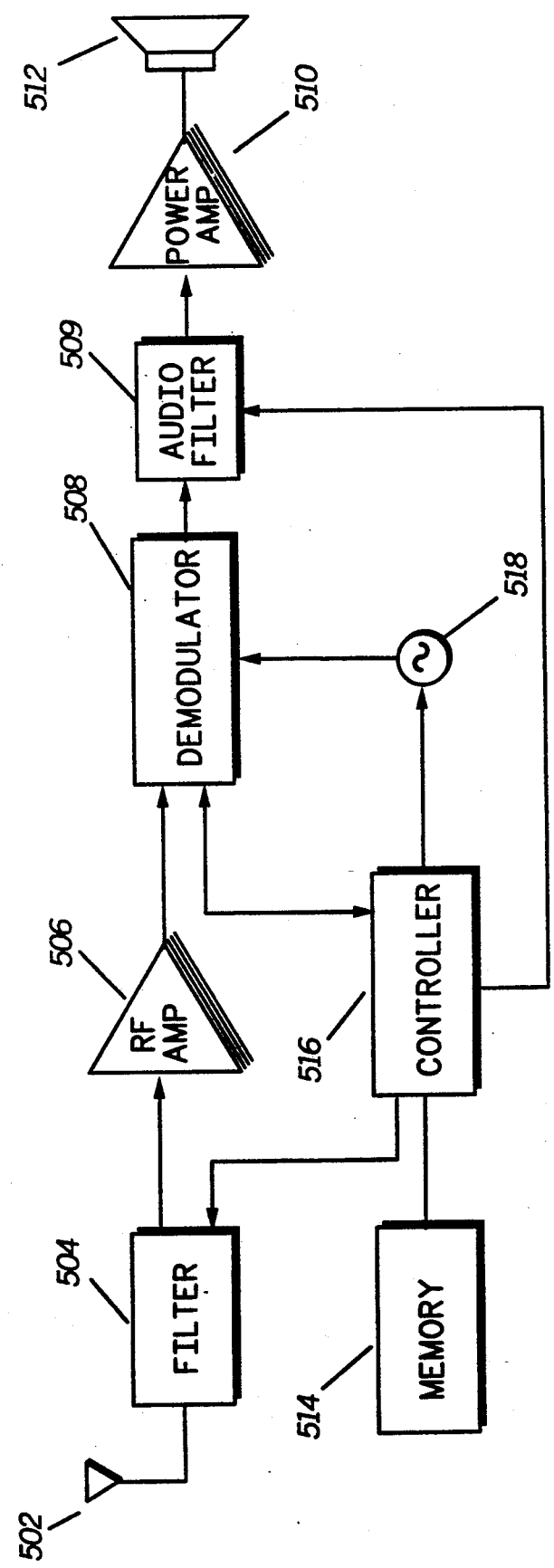
FIG. 5 is a block diagram of a communication device incorporating the resistive-capacitive network in accordance with the invention.

Referring now to FIG. 5, a block diagram of a receiver 500 in accordance with the principles of the present invention is shown. The receiver 500 includes an antenna 502 by which radio frequency signals are received and applied to the filter 400 for filtering. The frequency of operation of the filter 504 is controlled by a controller 516. Coupled to the controller 516 is a memory block 514 that provides the controller 516 with frequency information and other information relevant to the operation of the receiver 500. This information is translated at the controller 516 and converted to relative values used to command the frequency of operation of the filter 400. Filtered signals are amplified by an RF amplifier 506 and applied to a demodulator 508. The demodulator 308 uses the oscillator signal of an oscillator 518. The oscillator 318 determines the operating frequency of the receiver 500. This oscillator 518 includes a resistive-capacitive network similar to 100. Once again, the controller 516 controls the operating frequency of the oscillator 518 by controlling the biasing voltage of its electronically tunable network. The output of the demodulator 508, is coupled to a power amplifier 510 via an audio filter 509. The filtering performance of the filter 509 is once again controlled by the controller 516. Filtered signals at the output of the filter 509 are amplified by the amplifier 510 and applied to a speaker 512. Information on the frequency of operation of the filters 504 and 509 and the oscillator 518 are stored in the memory 514 and communicated to the controller 516 upon request.

The ability to control the frequency of operation of the filter 504 provides the ability to integrate the entire receiver 500 in one integrated circuit giving rise to single chip receivers. The predicament in fabricating a single chip receiver can now be removed by eliminating the need for discrete components that were not realizable in semiconductor. With the network 100 fully integratable it is now possible to electronically control the operation of many electronic circuits previously not possible. A significant benefit of this is the elimination of the need to proliferate receivers assemblies to cover a desired operating range.

Although the focus of this embodiment has been on filters using a high dielectric integrated tunable network, it is well understood that a variety of electronic circuits may be implemented using the principles of the present invention. Thus, a variety of filters such as low pass, high pass, band reject, etc. may be implemented using these principles. Other circuits such as tunable inductor simulation using capacitive components is well within the scope of the operational of the network 100.

In summary, it may be seen that favorable results may be obtained from utilizing this structure, including integration of wide dynamic range tunable circuits, prevention of contact between the top and bottom electrodes through conducting grain boundaries and voids, reduction of nonhomogeneous and field enhancing regions, lower loss, higher Q, improvement in film resistivity, improved electrical breakdown, and improved storage charge characteristics. The foregoing examples are intended to serve as an illustration of the preferred embodiment of the invention. Accordingly, it is not intended that the invention be limited except as by the appended claims herein.

What is claimed is:

1. An integrated-distributed-resistive-capacitive network, comprising:

a high dielectric electronically-tunable Zirconium Titanate integrated capacitor, comprising:
  a semiconductor having a layer of semi-conductive material of a higher resistivity than the semiconductor;
  a depletion layer formed in the high resistivity layer;
  an insulating layer of Zirconium Titanate formed on the high resistivity layer;
  a conductive electrode formed on the dielectric layer;
a resistive layer formed on the high dielectric semiconductor integrated capacitor; and
a plurality of electrical contact terminals coupled to the resistive layer.

2. An integrated-distributed-resistive-capacitive network, comprising:
  a high dielectric electronically-tunable semiconductor integrated capacitor, comprising:
    a semiconductor having a layer of semi-conductive material of a higher resistivity than the semiconductor;
    a depletion layer formed in the high resistivity layer;
    an insulating layer formed on the high resistivity layer, the insulating layer having a dielectric constant greater than 16;
    an conductive electrode formed on the dielectric layer;
  a resistive layer formed on the high dielectric semiconductor integrated capacitor; and
  a plurality of electrical contact terminals coupled to the resistive layer.

3. An integrated distributed resistive-capacitive network having a control input, a common line and two signal lines, comprising:
  a Zirconium Titanate integrated capacitor; having a control-line plate coupled to the control input and a first contact plate coupled to the common line;
  a resistive layer formed over the integrated capacitor; and
  a plurality of contact terminals coupled to the resistive layer and providing the two signal lines.

4. A communication device, comprising:
  receiver means for receiving radio communication signals, the means for receiving having at least one integrated electronically tunable distributed resistive-capacitive network, the integrated network including:
    a Zirconium Titanate integrated capacitor;
    a resistive layer formed on the high dielectric semiconductor integrated capacitor; and
    a plurality of contact terminals coupled to the resistive layer.

* * * * *